(12) United States Patent
Huffenus et al.

(10) Patent No.: US 8,665,024 B2
(45) Date of Patent: Mar. 4, 2014

(54) CONTROL OF MINIMUM CURRENT IN OUTPUT TRANSISTORS OF AN AMPLIFIER OUTPUT STAGE

(75) Inventors: Alexandre Huffenus, Grenoble (FR); Serge Pontarollo, Saint Egreve (FR)

(73) Assignee: EASII IC SAS, Grenoble Cedex (FR)

( * ) Notice: Subject to any disclaimer, the term of this patent is extended or adjusted under 35 U.S.C. 154(b) by 88 days.

(21) Appl. No.: 13/443,024

(22) Filed: Apr. 10, 2012

(65) Prior Publication Data
US 2012/0274405 A1    Nov. 1, 2012

(30) Foreign Application Priority Data
Apr. 27, 2011    (FR) ...................................... 11 53603

(51) Int. Cl.
*H03F 3/26*    (2006.01)

(52) U.S. Cl.
USPC .......................................... 330/269; 330/273

(58) Field of Classification Search
USPC .................... 330/264, 267, 269, 273
See application file for complete search history.

(56) References Cited

U.S. PATENT DOCUMENTS

| | | | |
|---|---|---|---|
| 5,642,078 A | 6/1997 | Navabi | |
| 5,783,970 A * | 7/1998 | Pleitz | ........................... 330/269 |
| 6,127,891 A | 10/2000 | Eschauzier | |
| 6,525,603 B1 * | 2/2003 | Morgan | ......................... 330/52 |
| 2002/0180529 A1 | 12/2002 | Maejima | |
| 2009/0102551 A1 | 4/2009 | Bandyopadhyay | |

OTHER PUBLICATIONS

Search report issued Dec. 22, 2011 on French Patent Application 11/53603.

* cited by examiner

*Primary Examiner* — Steven J Mottola
(74) *Attorney, Agent, or Firm* — Vedder Price PC

(57) ABSTRACT

An amplifier including: an output stage having two first power supply terminals capable of receiving a first voltage defined by first positive and negative variable potentials with respect to a reference potential; and a circuit for controlling the current in transistors of the output stage with a reference value, wherein the output stage includes a first and a second MOS transistors in series between the first two terminals, the junction point of this series association defining an output terminal of the amplifier; the control circuit includes two measurement MOS transistors having their respective sources and gates coupled to the respective sources and gates of the first and second transistors of the output stage; at least one control branch, comprising transistors in series between two terminals of application of a second voltage, defines nodes connected to the gates of the output transistors, said second voltage being greater than the first one.

8 Claims, 4 Drawing Sheets

CONTROL OF MINIMUM CURRENT IN OUTPUT TRANSISTORS OF AN AMPLIFIER OUTPUT STAGE

BACKGROUND

1. Technical Field

The present disclosure generally relates to amplifiers and, more specifically, to audio amplifiers. The present invention more specifically applies to the forming of an output stage of such an amplifier.

2. Description of the Art

Many electronic circuits performing audio amplifier functions are known. Such amplifiers are generally formed of several successive stages between an input stage to which is applied a signal to be amplified and an output stage having an output terminal providing an electric signal to a loudspeaker. The different amplifications stages are generally differential, the output stage being a stage with differential inputs and with a non-differential output.

A recurring problem of amplifiers is the consumption and the loss in output stage transistors due to the low useful signal level as compared with the power supply voltage. This problem is particularly critical in portable devices powered by a battery. It must be possible to decrease the power supply voltage in the idle state or when the amplitude of the signal to be amplified is low.

It has already been provided to use a switched-mode power supply enabling to decrease the output stage power supply voltage according to the level required for the output signal. In this type of circuit, the power supply voltage of the series-connected transistors of the output stage is variable and regulated according to the needs associated with the input signal level.

The minimum value of this voltage must allow a proper operation of the series transistors of the output stage. Even when MOS transistors with a low threshold voltage are used, the efficiency remains unsatisfactory.

To improve the operation of these amplifiers, and especially their harmonic distortion rate, systems adjust the current in the output stage MOS transistors. To achieve this, their gate voltage is controlled according to the result of a measurement of the current that they conduct. Such systems enable to set a current to a value sufficient for the output stage operation, which is the minimum current of the output stage transistors when the output voltage level is zero (idle amplifier).

The output stages to which the present invention applies are so-called push-pull stages, generally formed of two MOS transistors in series between the two power supply voltages, the output terminal corresponding to their junction point. It is then desirable, even in operation, for that of the transistors which is not used to amplify the signal to be crossed by a minimum current.

U.S. Pat. No. 6,366,165 describes an amplifier using the same power supply voltages for the output stage and the control of the gate voltages of the output stage transistors. This requires a power supply voltage greater than a MOS transistor threshold voltage, which decreases the efficiency for low-amplitude signals.

U.S. Pat. No. 5,055,797 describes a solution wherein the respective biasings of the two N-channel MOS transistors of an output stage are controlled based on a measurement of the currents in each of the transistors. This measurement is performed with current-to-voltage conversion resistors interposed in the series association of the output transistors. This measurement is then exploited to control the biasing of the gates of these transistors and, thereby, their respective currents. The presence of such resistors in series with the output transistors introduces additional losses. Further, the values of these resistors are not negligible, since they would otherwise generate an unacceptable inaccuracy of the measurements.

It has already been considered to provide measurement transistors (for example, in U.S. Pat. No. 4,853,645), but the minimum output stage power supply voltage remains significant.

Other circuits set the gate-source voltage of the output transistors in fixed manner (with no control). Such is for example the case for the solution provided in U.S. Pat. No. 5,783,970.

All these solutions are sensitive to temperature variations and to possible mismatches of the transistors.

BRIEF SUMMARY

An object of an embodiment of the present invention is to provide an amplifier which overcomes all or part of the disadvantages of usual stages.

Another object of an embodiment of the present invention is to provide a solution more specifically adapted to a control of the minimum current in output transistors.

Another object of an embodiment of the present invention is to provide a solution enabling to decrease the output stage power supply voltage.

Another object of an embodiment of the present invention is to provide a solution particularly well adapted to integrated circuits.

To achieve all or part of these and other objects, the present invention provides an amplifier comprising:

an output stage having two first power supply terminals capable of receiving a first voltage defined by first variable positive and negative potentials with respect to a reference potential; and a circuit for controlling the current in transistors of the output stage with a reference value, wherein:

the output stage comprises a first and a second MOS transistors in series between the first two terminals, the junction point of this series association defining an output terminal of the amplifier;

the control circuit comprises two measurement MOS transistors having their respective sources and gates coupled to the respective sources and gates of the first and second transistors of the output stage;

at least one control branch, comprising transistors in series between two terminals of application of a second voltage, defines nodes connected to the gates of the output transistors, said second voltage being greater than the first one.

According to an embodiment of the disclosure, the first voltage is capable of reaching a value smaller than the threshold voltage of a MOS transistor.

According to an embodiment of the disclosure, the source of each measurement transistor is connected to the source of the first or second transistor by a resistive element.

According to an embodiment of the disclosure, the respective gates of the first and second transistors are connected to output terminals of the control circuit.

According to an embodiment of the disclosure, the control circuit comprises at least one differential pair for comparing a reference current with data representative of the lowest current flowing through the first and second transistors.

According to an embodiment of the disclosure, the control circuit controls the current in parallel branches to which the gates of the first and second transistors are connected.

According to an embodiment of the disclosure, the control circuit controls the current in a branch to which are connected the gates of the first and second transistors.

According to an embodiment of the disclosure, the first and second transistors have an N channel.

According to an embodiment of the disclosure, the first and second transistors respectively have a P channel and an N channel.

The foregoing and other features and advantages of the present invention will be discussed in detail in the following non-limiting description of specific embodiments in connection with the accompanying drawings.

DETAILED DESCRIPTION

Figure 1:
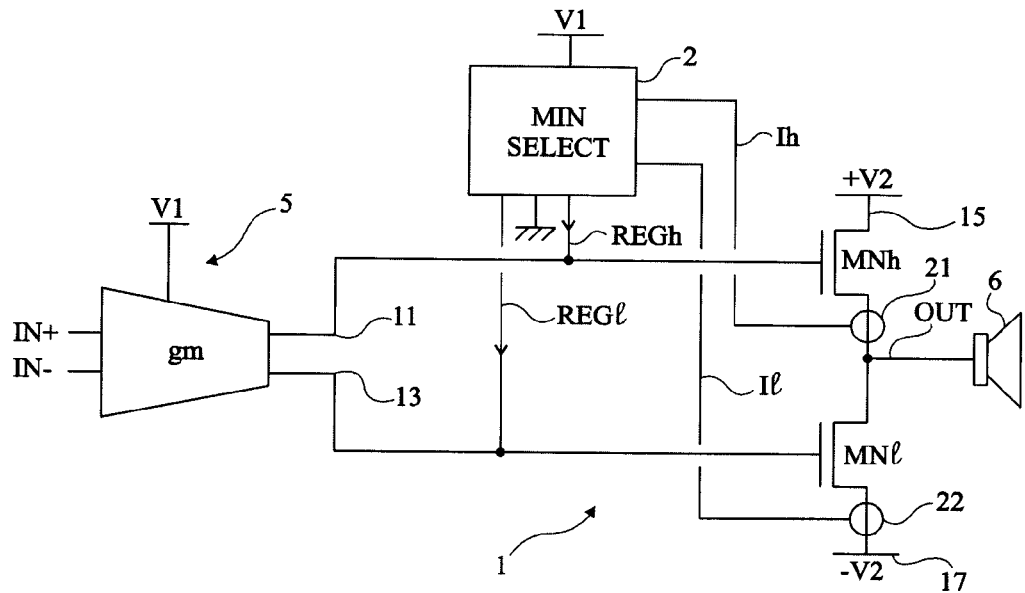
FIG. 1 is a block diagram of an embodiment of an amplifier output stage.

The same elements have been designated with the same reference numerals in the different drawings. For clarity, only those elements which are useful to the understanding of the described embodiments have been shown and will be described. In particular, the generation of the signals to be amplified and the destination of these signals have not been detailed, the described embodiments being compatible with usual applications.

FIG. 1 is a block diagram of an embodiment of a power amplifier. This amplifier comprises an output stage 1 comprising two N-channel MOS transistors MNh and MNl in series between two terminals 15 and 17 of application of respective positive and negative power supply voltages +V2 and −V2, preferably but not necessarily identical. An output terminal OUT of the output stage, intended to be connected to a load 6 (for example, a loudspeaker), is connected between transistors MNh and MNl. The respective gates of transistors MNh and MNl are directly connected to differential input terminals 11 and 13 of the output stage.

The above example illustrates the case of two N-channel MOS transistors in series. However, as will be seen hereafter, the output stage may comprise two P-channel MOS transistors in series or an association of a P-channel MOS transistor and of an N-channel MOS transistor.

The two differential input terminals 11 and 13 of output stage 1 receive signals originating from an input stage 5, or from an intermediate stage between an input stage and the output stage. Stage 5 receives, on two differential input terminals IN+ and IN−, a signal to be amplified. Two outputs of stage 5 are connected to terminals 11 and 13.

For simplification, reference will be made hereafter to an input stage to designate stage 5, but it should be noted that the number of intermediate amplification stages between the application of the signals to be amplified and the output stage depends on applications.

In an output stage of the type illustrated in FIG. 1, a single one of transistors MNh and MNl operates at a given time, either to provide a current at the output (transistor MNh), or to sample a current from the output (transistor MNl), according to the sign of the amplified signal with respect to a common mode level (generally, the ground).

The assembly of FIG. 1 further comprises a circuit 2 for controlling the currents in transistors MNh and MNl. Circuit 2 exploits two pieces of information Ih and Il representative of the respective source currents of transistors MNh and MNl. These pieces of information are measured by means 21 and 22 symbolically shown in FIG. 1. Circuit 2 sets the current in the transistors by varying the respective gate voltages of transistors MNh and MNl with two signals REGh and REGl.

An architecture such as illustrated in FIG. 1 approximately corresponds to the architecture described in above-mentioned U.S. Pat. No. 5,055,797. In this document, elements 21 and 22 are formed of resistors, which adversely affect the amplifier operation.

In the embodiments which will be described, means 21 and 22 introduce no resistive elements in the series association of transistors MNh and MNl.

Circuit 2 has the function of determining the minimum current from among currents Ih and Il and of comparing this minimum current with a reference current. The transistor conducting the lowest current is that which does not provide the output signal. Circuit 2 controls this minimum current with respect to a reference level. Both transistors remain conductive while the amplifier is active, to avoid generating problems due to switchings.

Figure 2:
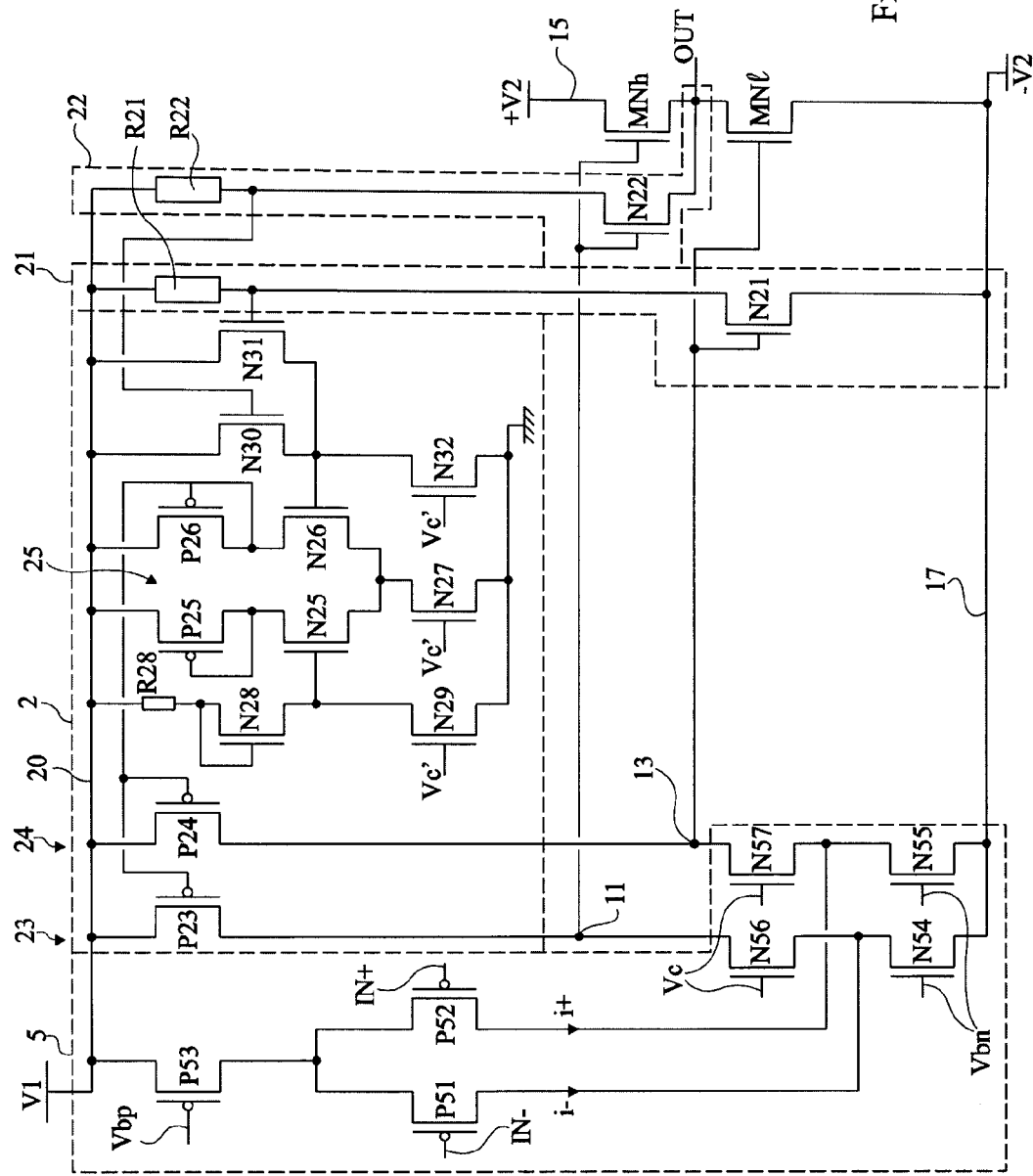
FIG. 2 is an electric diagram of an embodiment of the output stage of FIG. 1.

FIG. 2 is an electric diagram of an embodiment of an amplifier output stage and of a circuit 2 for controlling the current of the output transistors.

Input stage 5 (or differential output stage of the previous stage) for example comprises two P-channel transistors P51 and P52 having their respective gates defining terminals IN− and IN+ and having their sources connected, via a P-channel MOS transistor P53, to a terminal 20 of application of voltage V1. The respective drains of transistors P51 and P52 are connected to terminal 17 of application of voltage −V2 by N-channel transistors N54 and N55.

Transistors P53, N54, and N55 are bias transistors having their respective gates receiving, for the P-channel transistor (P53), a voltage Vbp and, for the N-channel transistors (N54 and N55), a voltage Vbn. Bias voltages Vbn and Vbp are generally generated in the integrated circuit by current mirror assemblies, which are not the object of the described embodiments and which can be found in any circuit based on MOS transistors.

The respective drains of transistors P51 and P52 are further connected, via N-channel MOS transistors N56 and N57 playing the role of cascodes, to terminals 11 and 13.

Nodes 11 and 13 are further connected to terminal 20 of application of voltage V1 by two P-channel MOS transistors P23 and P24. These transistors belong to circuit 2 and are controlled, as will be seen hereafter, to regulate the currents in transistors MNh and MNl. For the time being, it should only be noted that transistors P23 and P24 are respectively in series with transistors N56, N54 and N57, N55 between terminals 20 and 17. Such series associations form two branches 23 and 24 in parallel between terminals 20 and 17 and perform a current-to-voltage conversion to control the gates of transistors MNh and MNl according to a variation of the currents in transistors P52 and P51, reflecting a variation of the potential difference between input terminals IN+ and IN−. Transistors P23 and P24 define controllable current sources setting the minimum currents in transistors MNh and MNl.

Usually, an imbalance between the potentials applied to terminals IN+ and IN− translates as an imbalance between currents i+ and i− of the drains of transistors P52 and P51. This imbalance is passed on to branches 23 and 24 for controlling the gates of transistors MNh and MNl and translates as a variation of the currents in these transistors, and thus as a variation of the level of output voltage Vout.

As compared with a balanced position, a decrease of current i+ in transistor P52 (and an increase of current i−) in transistor P51 translates as an increase of the current in transistor N57 and a decrease of the current in transistor N56 and, accordingly, as a decrease of the current in transistor MNl and an increase of the current in transistor MNh, which causes an increase of the output voltage. Conversely, a decrease of current i+ and an increase of current i− cause a decrease of voltage Vout.

In the described embodiment, the biasing of transistors P23 and P24 is controlled according to a reference value, to maintain the minimum current of transistors MNh and MNl at a sufficient value for the operation of the output stage.

Elements 21 and 22 for measuring the information present in transistors MNh and MNl are formed of a resistor R21, respectively R22, in series with an N-channel MOS transistor N21, respectively N22, between terminal 20 and the respective sources of transistors MNl (and thus terminal 17) and MNh (and thus terminal OUT). The respective gates of transistors N21 and N22 are connected to the gates of transistors MNl and MNh. Transistors N21 and N22 have a smaller size than transistors MNl and MNh. The currents flowing through transistors N21 and N22 are proportional to the currents respectively crossing transistors MNl and MNh. Resistors R21 and R22 are used as a current-to-voltage conversion element to exploit such measurements. All other conversion means may be used.

Circuit 2 forms a circuit for comparing the minimum current from among the currents of branches 21 and 22 with a reference current. The comparison stage is formed of a differential pair 25 comprising two branches in parallel between terminal 20 and an N-channel MOS bias transistor N27 connected to ground and controlled by a signal Vc'. Each branch comprises a P-channel MOS transistor P25, P26 in series with an N-channel MOS transistor N25, N26. Transistors P25 and P26 are diode-assembled (with their gates and drains connected). Further, transistor P26 is current-mirror-assembled with transistors P23 and P24 by having its gate connected to the gates of these two transistors. The gate of transistor N25 is connected to the midpoint of a reference branch, formed of a resistor R28 and of two N-channel MOS transistors N28 and N29 in series between terminal 20 and the ground. Transistor N29 is a bias transistor controlled by signal Vc'. Transistor N28 is diode-assembled (with its gate and drain connected). Differential pair 25 compares the currents provided by measurement circuits 21 and 22 with the current in this reference branch. To achieve this, the gate of transistor N26 is connected to terminal 20 by two N-channel MOS transistors N30 and N31 in parallel having their respective gates connected to the junction points of transistor N22 and resistor R22 and of transistor N21 and resistor R21. The gate of transistor N26 is grounded by a bias transistor N32 controlled by signal Vc'.

Circuit 2 adjusts the current in branches 23 and 24 according to the current in that of transistors MNl or MNh which conducts the lowest current (the inactive transistor), so that this current is equal to this minimum current.

This current depends on the reference current, on the size ratio between transistors MNh and MNl and measurement transistors N21 and N22, on the current in transistors N30 and N31, on the values of resistors R21, R22, and R28, and on the size of transistors N28, N30, and N31. The object is to enable the switched-mode power supply (not shown) setting voltages +V2 and −V2 to decrease as much as possible the voltage applied between terminals 15 and 17 (typically smaller than 0.7 volt).

Voltage 2V2 (+V2−(−V2)) is regulated to the lowest possible value and voltage V1 is fixed and selected to allow an operation of circuit 2 in the worst case, that is, so that node 13 can reach a voltage corresponding to output voltage OUT plus an N-channel MOS transistor gate-source voltage (that of transistor MNl). Dissociating the power supply voltage of the output stage from the power supply voltage of the control circuit (and of the input stage) allows an additional lowering of voltage 2V2.

The low limit for voltage 2V2 (+V2−(−V2)) depends on the minimum voltage required for transistors MNh and MNl to remain conductive and, due to the control of their gate-source voltages by a minimum value, this voltage may decrease to a few hundreds of millivolts (down to approximately 200 mV), below a transistor MOS threshold voltage.

An advantage of the output stage and of the control circuit illustrated in FIG. 2 is that the reliability of the current measurements in the output transistors is improved. In particular, this measurement is independent from temperature variations and from variations in transistor threshold voltages. Indeed, the same gate-source voltage is applied to transistors MNl and N21, as well as MNh and N22.

As compared with a solution where resistors are inserted in the output branch, the described embodiment allows an operation with a still lower power supply voltage by minimizing voltage drops in the output branch.

As a variation, circuit 2 may comprise two differential pairs of the type of pair 25, respectively assigned to each of the output transistors, and thus to each of branches 23 and 24. Such a modification is easy.

What has been described in relation with FIG. 2 based on an output stage formed of N-channel MOS transistors transposes to an output stage formed of P-channel MOS transistors. All the N-channel MOS transistors of FIG. 2 are replaced with P-channel transistors and all the P-channel transistors are replaced with N-channel transistors.

Further, what has been described hereabove also transposes to a power supply V1 which is negative with respect to ground. In this case, circuit 2 is placed between the ground and this negative power supply.

Figure 3:
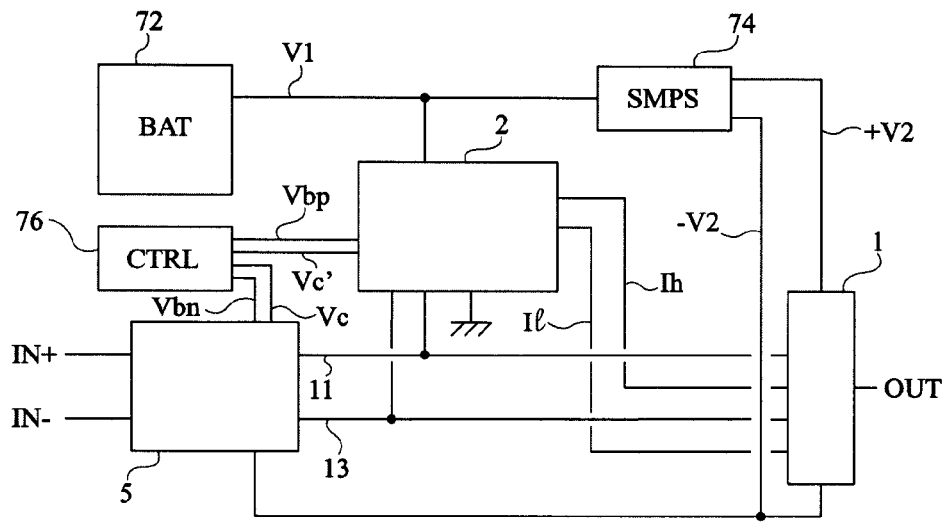
FIG. 3 is a block diagram of an embodiment of an amplifier.

FIG. 3 is a block diagram of a circuit comprising an amplifier such as illustrated in FIG. 2. This circuit comprises, among others, a power supply source 72, for example, a battery (BAT), a voltage regulator, a switched-mode power supply, etc., providing fixed voltage V1 and a switched-mode power supply 74 (SMPS) generating, for example based on voltage V1, variable voltages +V2 et −V2. The switched-mode power supply receives information (via a connection not shown) relative to the output voltage to regulate voltages +V2 and −V2. A control circuit 76 (CTRL) provides bias voltages Vc and Vc' as well as bias voltages Vbp and Vbn. Such an architecture is usual per se.

Figure 4:
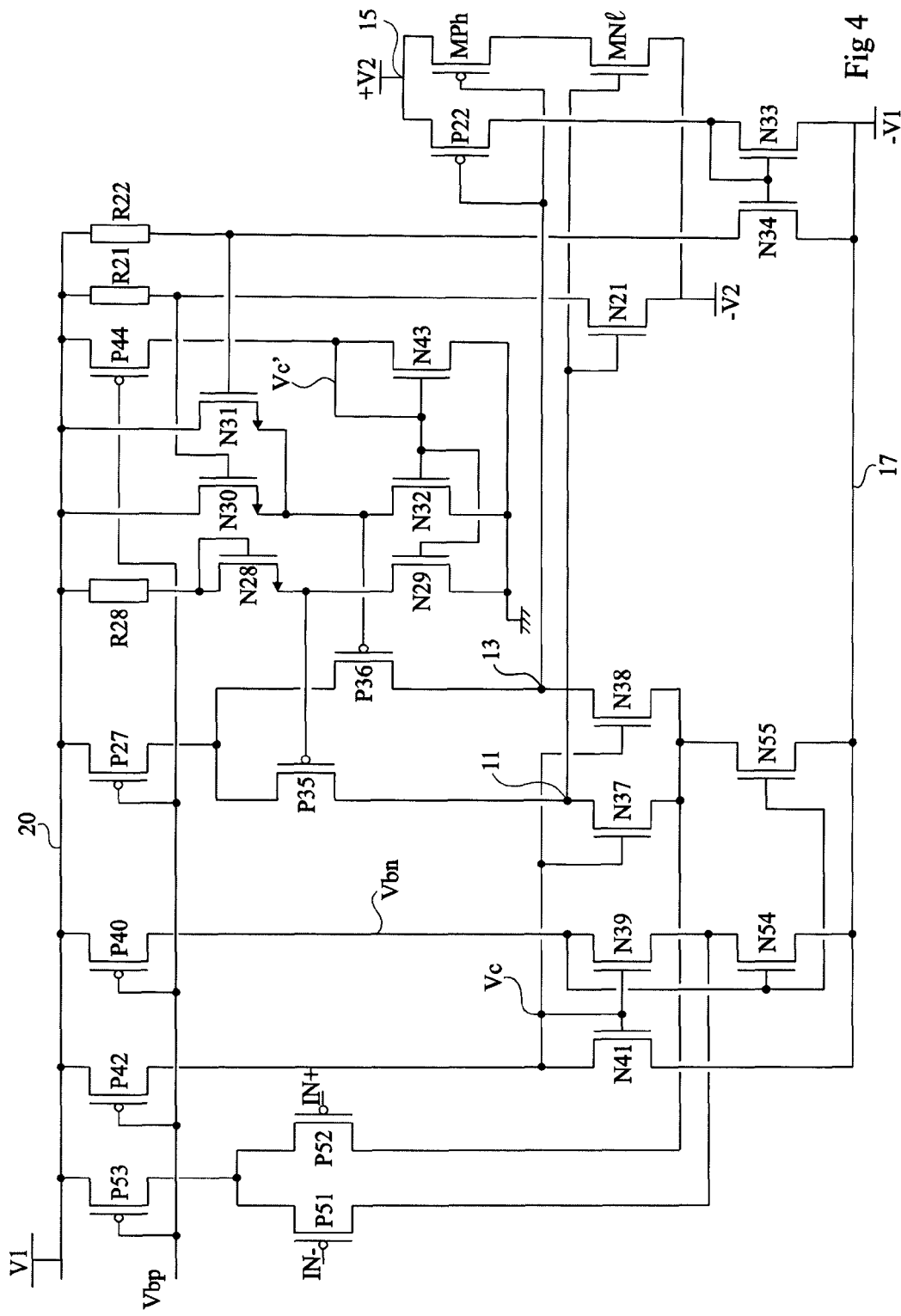
FIG. 4 is an electric diagram of another embodiment of the output stage of FIG. 1.

FIG. 4 is an electric diagram showing another embodiment where the output stage is formed of a P-channel MOS transistor MPh in series with an N-channel MOS transistor MNh. As compared with the circuit of FIG. 2, transistor N22 becomes a P-channel transistor P22 and this transistor is associated in series with a N-channel transistor N33, diode- and current-mirror-assembled on an N-channel transistor N34 connecting resistor R22 to terminal 17, the source of transistor P22 being directly connected to terminal 15.

Further, transistors N33, N34, N54, and N55 have their sources connected to a fixed voltage −V1, different from voltage −V2 to which the sources of transistors MNl and N21 are connected. Voltage −V1, equal to or different from voltage V1 in absolute value, is smaller than the reference voltage (generally, the ground) to which transistors N29, N32, and N43 are connected. A voltage −V1 different from voltage −V2 allows the operation of transistors P22 and MPh, even with a slightly negative voltage −V2.

On the side of circuit 2, the assembly is modified to take the modification of the output stage into account. Further, assemblies for generating, based on voltage Vbp, bias voltages Vbn, Vc, and Vc', have been illustrated.

Transistors N25 and N26 are thus replaced with P-channel transistors, P35 and P36, having their sources connected to terminal 20 by a bias transistor P27 receiving voltage Vbp on its gate. The drains of transistors P35 and P36 are connected by N-channel transistors, N37 and N38, to the drain of transistor N55. Transistor N54 is connected, by an N-channel transistor N39 and a P-channel transistor P40 in series, to terminal 20. Transistor P40 is biased by signal Vbp and its drain provides bias voltage Vbn. Transistors N37, N38, and N39 are cascode-assembled on a diode-assembled transistor N41, which is connected, via a P-channel transistor P42, to terminal 20. Transistor P42 is biased by signal Vbp. The drain of transistor N41 provides voltage Vc. Finally, transistors N29 and N32 are current-mirror-assembled on a diode-assembled N-channel transistor N43, in series with a P-channel transistor P44 between terminals 20 and the ground, transistor P44 being biased by voltage Vbp. The entire assembly is powered on with signal Vbp. The transposition of the biasing assemblies to the circuit of FIG. 2 is within the abilities of those skilled in the art.

Figure 5:
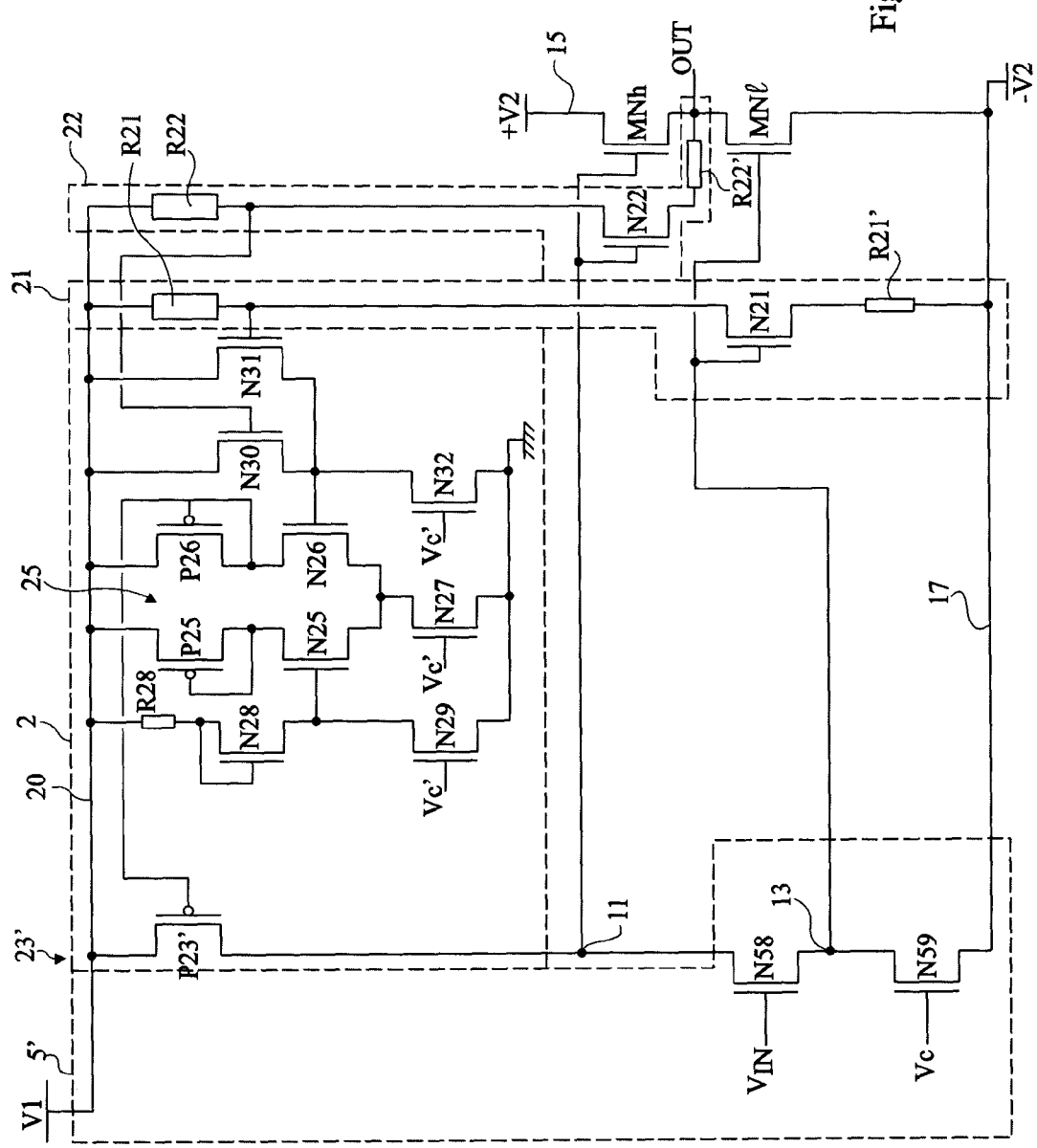
FIG. 5 is an electric diagram of a variation of FIG. 2.

FIG. 5 shows a variation of FIG. 2, adapted to a non-differential input stage 5'. As compared with FIG. 2, an input terminal of this stage 5' receives a voltage Vin to be amplified. This voltage is applied to the gate of an N-channel MOS transistor N58. This transistor is interposed in a branch 23' between an output transistor P23' of circuit 2 (controlled like transistors P23 and P24 of FIG. 2), connected to terminal 20, and an N-channel bias transistor N59 connected to terminal 17. Transistor N59 is controlled by signal Vc. Terminal 13 (connected to the gates of transistors N21 and MNl) corresponds to the junction point of transistors N58 and N59. The operation of the circuit of FIG. 4 can be deduced from the previously-discussed operations.

FIG. 5 illustrates another variation according to which resistors R21' and R22' (optional) are interposed between transistor N21 and terminal 17 and between transistor N22 and terminal OUT. This enables to decrease the current in the measurement branches. This variation can be transposed to the other embodiments.

As a non-limiting embodiment, an amplifier such as illustrated in FIG. 2 may be formed with the following values:
 resistances R21 and R22: on the order of 80 kohms;
 size ratio between the measurement transistors and the output stage transistors: on the order of 1/100;
 voltage V1: approximately 3.6 volts; and
 voltage V2: variable between approximately 0.2 and 2 volts.

Various embodiments have been described. Various alterations, modifications, and improvements will occur to those skilled in the art. In particular, the dimensions to be given to the different transistors and resistors are within the abilities of those skilled in the art based on the functional indications given hereabove and on the power supply voltages for which the amplifier is intended. Further, although the above embodiments have been described in relation with examples of circuits only comprising MOS transistors, such embodiments transpose to circuits partially formed with bipolar transistors, provided for the measurement (N21 and N22 or P22) and amplification (MNl and MNh or MPh) transistors to remain MOS transistors. Such a transposition is within the abilities of those skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An amplifier comprising:
   an output stage (1) having two first power supply terminals (15, 17) capable of receiving a first voltage defined by first positive (+V2) and negative (−V2) variable potentials with respect to a reference potential; and
   a circuit (2) for controlling the current in transistors of the output stage with a reference value, wherein:
   the output stage comprises a first and a second MOS transistors (MNh, MNl; MPh, MNl) in series between the first two terminals, the junction point of this series association defining an output terminal (OUT) of the amplifier;
   the control circuit comprises two measurement MOS transistors (N21, N22; N21, P22) having their respective sources and gates coupled to the respective sources and gates of the first and second transistors of the output stage;
   at least one control branch (23, 24; 23'), comprising transistors in series between two terminals of application of a second voltage, defines nodes (11, 13) connected to the gates of the output transistors, said second voltage being greater than the first one; and
   the first voltage is capable of reaching a value smaller than the threshold voltage of a MOS transistor.

2. The amplifier of claim 1, wherein the source of each measurement transistor is connected to the source of the first or second transistor by a resistive element (R21', R22').

3. The amplifier of claim 1, wherein the respective gates of the first and second transistors (MNh, MNl; MPh, MNl) are connected to output terminals of the control circuit.

4. The amplifier of claim 1, wherein the control circuit (2) comprises at least one differential pair (25) for comparing a reference current with data representative of the lowest current flowing through the first and second transistors (MNh, MNl; MPh, MNl).

5. The amplifier of claim 1, wherein the control circuit (2) controls the current in parallel branches (23, 24) to which the gates of the first and second transistors (MNh, MNl; MPh, MNl) are connected.

6. The amplifier of claim 1, wherein the control circuit (2) controls the current in a branch (23') to which are connected the gates of the first and second transistors (MNh, MNl; MPh, MNl).

7. The amplifier of claim 1, wherein the first and second transistors (MNh, MNl) are N-channel MOS transistors.

8. The amplifier of claim 1, wherein the first and second transistors are respectively P-channel (MPh) and N-channel (MNl) MOS transistors.

* * * * *